(12) United States Patent
Coskun et al.

(10) Patent No.: US 10,585,360 B2
(45) Date of Patent: Mar. 10, 2020

(54) EXPOSURE SYSTEM ALIGNMENT AND CALIBRATION METHOD

(71) Applicant: Applied Materials, Inc., Santa Clara, CA (US)

(72) Inventors: Tamer Coskun, San Jose, CA (US); Qin Zhong, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/686,815

(22) Filed: Aug. 25, 2017

(65) Prior Publication Data

US 2019/0064683 A1 Feb. 28, 2019

(51) Int. Cl.
*G03F 7/20* (2006.01)
*G03F 9/00* (2006.01)

(52) U.S. Cl.
CPC ............ *G03F 9/7019* (2013.01); *G03F 7/707* (2013.01); *G03F 7/70516* (2013.01)

(58) Field of Classification Search
CPC ................................ G03F 9/7019; G03F 7/707
See application file for complete search history.

(56) References Cited

U.S. PATENT DOCUMENTS

| | | | | |
|---|---|---|---|---|
| 6,151,122 A | * | 11/2000 | Taniguchi | G03F 7/70358 356/399 |
| 6,277,532 B1 | * | 8/2001 | Yahiro | B82Y 10/00 430/22 |
| 6,400,441 B1 | * | 6/2002 | Nishi | G03F 7/70216 355/53 |
| 6,483,571 B1 | * | 11/2002 | Shiraishi | G03F 9/7015 355/53 |
| 6,590,636 B2 | * | 7/2003 | Nishi | G03F 7/2022 355/53 |
| 6,693,700 B2 | * | 2/2004 | Shima | G03F 7/70358 355/53 |
| 6,768,539 B2 | * | 7/2004 | Gui | G03F 7/70216 355/53 |

(Continued)

FOREIGN PATENT DOCUMENTS

KR 20110020111 B1 3/2011
KR 101420223 B1 7/2014

(Continued)

OTHER PUBLICATIONS

International Search Report and Written Opinion issued in corresponding International Patent Application No. PCT/US2018/046319, dated Dec. 3, 2018 (13 pages).

*Primary Examiner* — Deoram Persaud
(74) *Attorney, Agent, or Firm* — Patterson + Sheridan, LLP (57) ABSTRACT

Methods are provided that, in some embodiments that provide alignment of a first layer of a printing plate on a chuck. For example, in one embodiment, images of reference marks on a chuck are captured to determine the initial positions of the reference marks on the chuck. A reference model is created from those initial positions. Images of alignment marks on a reference plate are captured and the locations of the alignment marks are determined. A reference plate model is created from the positions of the alignment marks. A mapping model is then created from the reference model and the reference plate model.

20 Claims, 9 Drawing Sheets

(56) References Cited

U.S. PATENT DOCUMENTS

| | | | | |
|---|---|---|---|---|
| 7,251,018 B2* | 7/2007 | Van Buel | | G03F 7/70716 355/53 |
| 7,442,476 B2* | 10/2008 | Best | | B81C 3/001 257/E21.505 |
| 7,463,337 B2* | 12/2008 | Van Buel | | G03F 7/70716 355/72 |
| 2001/0055117 A1* | 12/2001 | Mizutani | | G03F 7/70691 356/401 |
| 2002/0085184 A1* | 7/2002 | Amano | | G03B 27/52 355/30 |
| 2002/0175300 A1* | 11/2002 | Suzuki | | G03F 7/70233 250/548 |
| 2002/0176096 A1* | 11/2002 | Sentoku | | G03F 7/70233 356/620 |
| 2003/0224262 A1 | 12/2003 | Lof et al. | | |
| 2005/0117140 A1* | 6/2005 | Mishima | | G03F 9/7011 355/72 |
| 2007/0072091 A1* | 3/2007 | Smith | | G03F 7/70458 430/5 |
| 2008/0062392 A1* | 3/2008 | Amano | | G03F 7/70258 355/52 |
| 2009/0073403 A1 | 3/2009 | De Mol et al. | | |
| 2009/0153817 A1* | 6/2009 | Kawakubo | | G03F 7/70633 355/53 |
| 2010/0271229 A1 | 10/2010 | Allen-Blanchette et al. | | |
| 2011/0096981 A1* | 4/2011 | Arnison | | G03F 9/7026 382/151 |
| 2015/0261097 A1* | 9/2015 | Mathijssen | | G03F 9/7026 355/67 |
| 2016/0086825 A1 | 3/2016 | Scanlan et al. | | |

FOREIGN PATENT DOCUMENTS

| | | |
|---|---|---|
| KR | 20160077116 B2 | 7/2016 |
| WO | 2014064290 A1 | 5/2014 |

* cited by examiner

EXPOSURE SYSTEM ALIGNMENT AND CALIBRATION METHOD

BACKGROUND

Field

Embodiments of the present disclosure generally relate to lithography and more specifically to calibrating alignment of a printing layer on a chuck.

Description of the Related Art

Photolithography is widely used in the manufacturing of semiconductor devices and display devices (e.g., liquid crystal displays (LCDs)). However, during lithography exposure, a chuck (upon which exposure is performed) can move due to repeated use; stress; and/or mechanical and/or thermal variations of the tool. These variations can affect the positional accuracy of the patterns printed on plates. The locations of printed patterns can also be incorrect when attempting to replicate a printed pattern on a tool, from a plate that was printed using a different tool.

Thus there is a need to calibrate for alignment printing layers on a tool.

SUMMARY

Embodiments herein generally relate to lithography and more specifically to calibrating alignment of a printing layer on a chuck. For example, in one embodiment, a method is provided that captures images of reference marks on a chuck and determines the initial locations of the reference marks. A reference model is created from the initial locations of the reference marks. Images are captured of alignment marks on a reference plate. Locations are determined of the alignment marks. A reference plate model is created from the locations of the alignment marks. Thereafter, a mapping model is created from the reference model and the reference plate model.

In another embodiment, a method is provided that creates a reference model from initial locations of reference marks on a chuck, creates a reference plate model from locations of alignment marks on a first reference plate, and creates a mapping model from the reference model and the reference plate model.

In yet another embodiment, a method is provided that captures images of reference marks on a chuck and determines initial positions of the reference marks on the chuck. Thereafter, the initial positions of the reference marks are stored in memory, images are captured of alignment marks on a reference plate, and positions of the alignment marks on the reference plate are determined and stored in memory.

Other embodiments of this disclosure are provided that include other methods, apparatuses, and systems having features similar to the method described herein.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, wherever possible, to designate identical elements that are common to the figures.

DETAILED DESCRIPTION

In the following description, numerous specific details are set forth to provide a more thorough understanding of this disclosure. As will be apparent to those skilled in the art, however, various changes using different configurations may be made without departing from the scope of this material. In other instances, well-known features have not been described in order to avoid obscuring this material. Thus, this disclosure is not considered limited to the particular illustrative embodiments shown in the specification and all such alternate embodiments are intended to be included in the scope of the appended claims.

Application panels, substrates and wafers are described interchangeably in this document. Embodiments disclosed herein utilize reference marks on a stage and alignment marks on a reference plate. The reference marks and alignment marks disclosed herein can be used to correct misalignment of the first printing layer on a stage.

In short, embodiments described herein generally relate to obtaining differences between initial reference marks and subsequently measured reference marks; and/or initial alignment marks and subsequently measured alignment marks.

Figure 1:
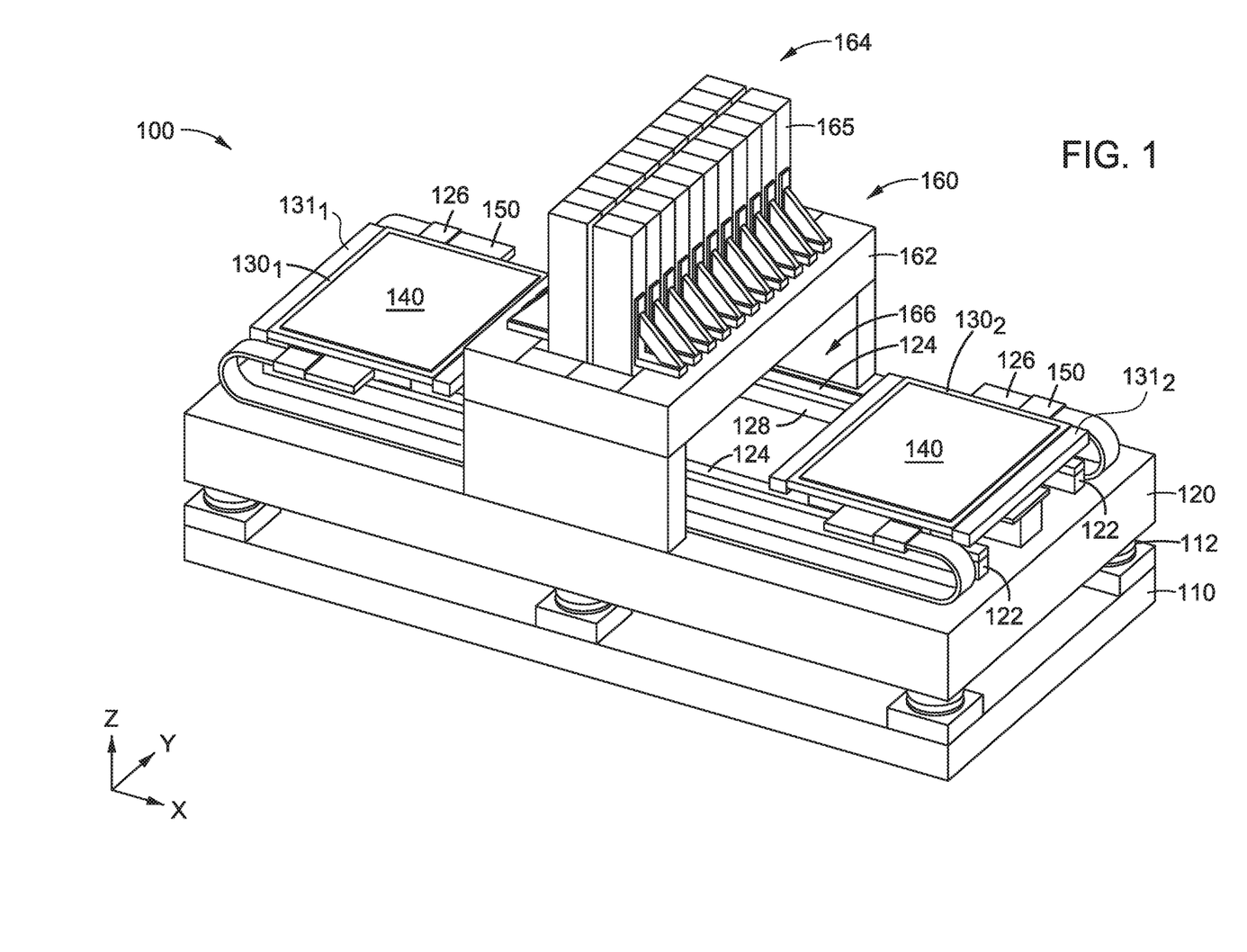
FIG. 1 is a perspective view of a system that may benefit from embodiments disclosed herein.

FIG. 1 is a perspective view of a system 100 that may benefit from embodiments disclosed herein. The system 100 includes a base frame 110, a slab 120, two or more stages 131 (e.g., stages $131_1$ and $131_2$), and a processing apparatus 160. A chuck 130 (i.e., chuck $130_1$ and $130_2$) rests on each respective stage 131. The base frame 110 may rest on the floor of a fabrication facility and may support the slab 120. Passive air isolators 112 may be positioned between the base frame 110 and the slab 120. The slab 120 may be a monolithic piece of granite, and the two or more stages 130 may be disposed on the slab 120. The substrates 140 on the chucks 130 may be supported by each of the two or more stages 131. A plurality of holes (not shown) may be formed in the chucks 130 for allowing a plurality of lift pins (not shown) to extend there-through. The lift pins may rise to an extended position to receive the substrate 140, such as from one or more transfer robots (not shown). The one or more transfer robots may be used to load and unload a substrate 140 from the two or more chucks 130.

The substrate 140 may, for example, be made of quartz and be used as part of a flat panel display. In other embodiments, the substrate 140 may be made of other materials such as glass. In some embodiments, the substrate 140 may have a photoresist layer formed thereon. A photoresist is sensitive to radiation and may be a positive photoresist or a negative photoresist, meaning that portions of the photoresist exposed to radiation will be respectively soluble or insoluble to photoresist developer applied to the photoresist after the pattern is written into the photoresist. The chemical composition of the photoresist determines whether the photoresist will be a positive photoresist or a negative photoresist. For example, the photoresist may include at least one of diazonaphthoquinone, a phenol formaldehyde resin, poly (methyl methacrylate), poly(methyl glutarimide), and SU-8. In this manner, the pattern may be created on a surface of the substrate 140 to form the electronic circuitry.

The system 100 may further include a pair of supports 122 and a pair of tracks 124. The pair of supports 122 may be disposed on the slab 120. The slab 120 and the pair of supports 122 may be a single piece of material. The pair of tracks 124 may be supported by the pair of the supports 122. The two or more stages 131 may move along the tracks 124 in the X-direction. In one embodiment, the pair of tracks 124 is a pair of parallel magnetic channels. As shown, each track 124 of the pair of tracks 124 is linear. In other embodiments, the track 124 may have a non-linear shape. An encoder 126 may be coupled to each stage 130 in order to provide location information to a controller (not shown).

The processing apparatus 160 may include a support 162 and a processing unit 164. The support 162 may be disposed on the slab 120 and may include an opening 166 for the two or more stages 131 to pass under the processing unit 164. The processing unit 164 may be supported by the support 162. In one embodiment, the processing unit 164 is a pattern generator configured to expose a photoresist in a photolithography process.

In some embodiments, the pattern generator may be configured to perform a maskless lithography process. The processing unit 164 may include a plurality of image projection apparatuses (not shown). In one embodiment, the processing unit 164 may contain 84 image projection apparatuses. Each image projection apparatus is disposed in a case 165. The processing apparatus 160 may be utilized to perform maskless direct patterning.

During operation, one of the two or more stages 131 moves in the X-direction from a loading position, as shown in FIG. 1, to a processing position. The processing position may refer to one or more positions of the stage 131 as the stage 131 passes under the processing unit 164. During operation, the two or more stages 131 may be lifted by a plurality of air bearings (not shown) and may move along the pair of tracks 124 from the loading position to the processing position. A plurality of vertical guide air bearings (not shown) may be coupled to each stage 131 and positioned adjacent an inner wall 128 of each support 122 in order to stabilize the movement of the stage 131. Each of the two or more stages 131 may also move in the Y-direction by moving along a track 150 for processing and/or indexing the substrate 140. Each of the two or more stages 131 is capable of independent operation and can scan a substrate 140 in one direction and step in the other direction. In some embodiments, when one of the two or more stages 131 is scanning a substrate 140, another of the two or more stages 131 is unloading an exposed substrate and loading the next substrate to be exposed.

A metrology system measures the X and Y lateral position coordinates of the chucks 130 on each of the two or more stages 131 in real time so that each of the plurality of image projection apparatuses can accurately locate the patterns being written in a photoresist covered substrate. The metrology system also provides a real-time measurement of the angular position of each of the chucks 130 on the two or more stages 131 about the vertical or Z-axis. The angular position measurement can be used to hold the angular position constant during scanning by means of a servo mechanism or it can be used to apply corrections to the positions of the patterns being written on the substrate 140.

Figure 2:
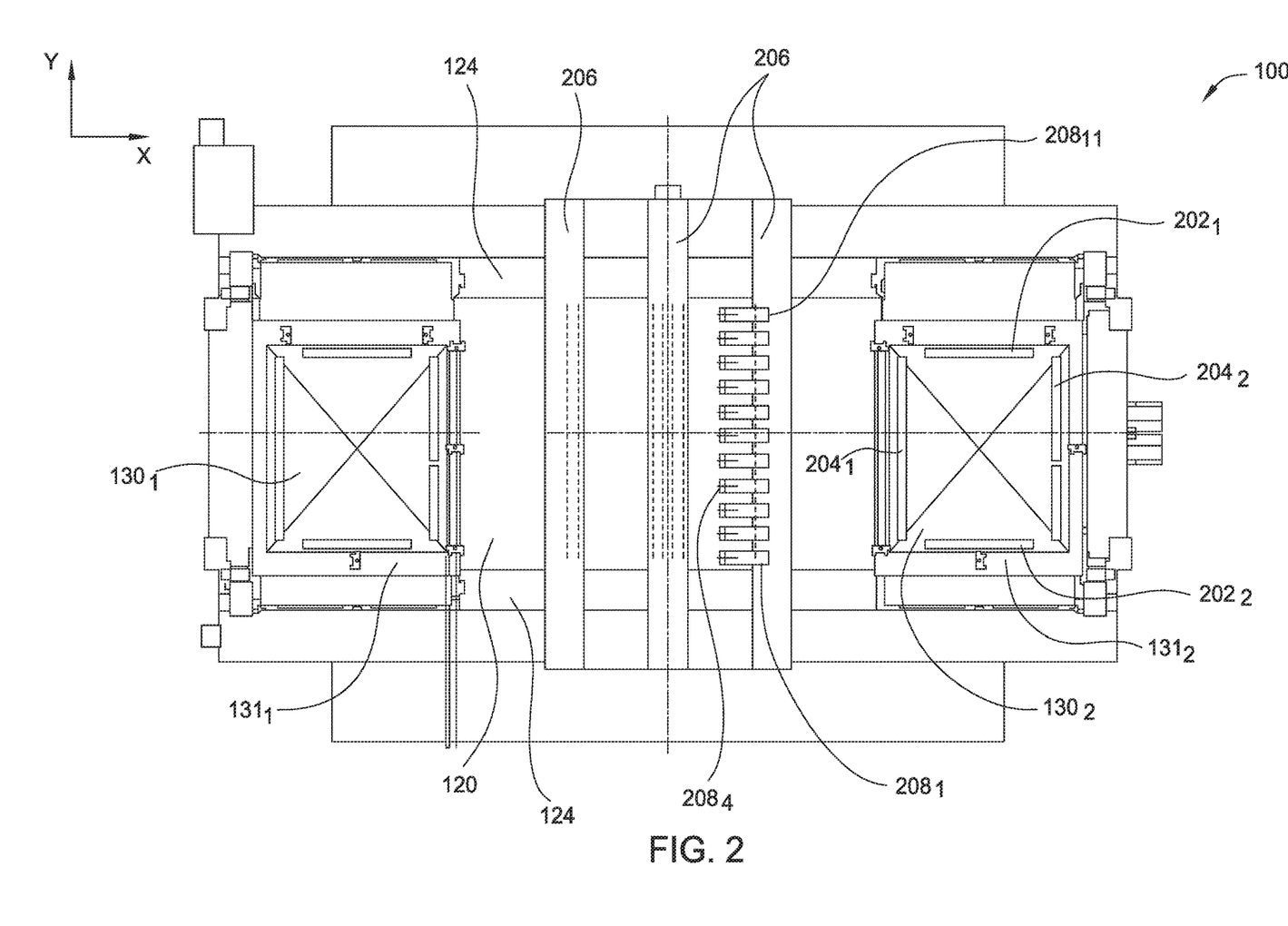
FIG. 2 is a top view of the system depicted in FIG. 1 in accordance with embodiments disclosed herein.

FIG. 2 is a top view of the system 100 depicted in FIG. 1 in accordance with embodiments disclosed herein. In FIG. 2, each of the chucks $130_1$ include multiple alignment regions. For example, chuck $130_2$ includes alignment regions $202_1$ and $202_2$ (collectively "alignment regions 202") that are substantially parallel to the X-axis; and alignment regions $204_1$ and $204_2$ (collectively "alignment regions 204") are substantially parallel to the Y-axis. Each of the alignment regions 202 and 204 includes a plurality of reference marks (not shown).

In FIG. 2, the case 165 is removed to expose eyes 208 that are supported by bridges 206. For illustrative purposes, three bridges 206 are shown. However, in other embodiments, system 100 includes a different number of bridges 206. The bridges 206 are used to support the eyes 208. Under each of the bridges 206 is a column of eyes $208_1, \ldots, 208_4, \ldots,$ and $208_{11}$ (collectively "eyes 208"). FIG. 2 depicts the column as including eleven eyes 208 for illustrative purposes only. In other embodiments, the number of eyes 208 under each bridge 206 is a number other than eleven. The eyes 208 are also referred to herein as "cameras 208."

The eyes 208 are used to capture images of the reference marks (not shown) in the alignment regions 202 and 204 so that the processing unit 164 can calculate and store location information for each of the reference marks. The eyes 208 are also used to capture images of alignment marks on a "reference plate" (not shown in FIG. 2) so that the processing unit 164 can calculate and store location information for each of the alignment marks. The eyes 208 capture images in a "scan and step" fashion or by directly moving the stage 131 to designed reference mark 304, 308 and alignment mark 310 locations. For example, in a "scan and step" operation, as the chuck 130 moves in the X-direction one line is scanned by an eye 208, then a "step," in the Y-direction, is made to an adjacent eye 208 that scans a line adjacent to the line that was previously scanned.

Although alignment regions 202 and 204 include a total of four regions, all four regions do not have to be scanned. In various embodiments, reference marks (not shown in FIG. 2) are placed on the chuck 130 so that only one alignment region 202 and one alignment region 204 is scanned to obtain images and location information for those reference marks.

Figure 3:
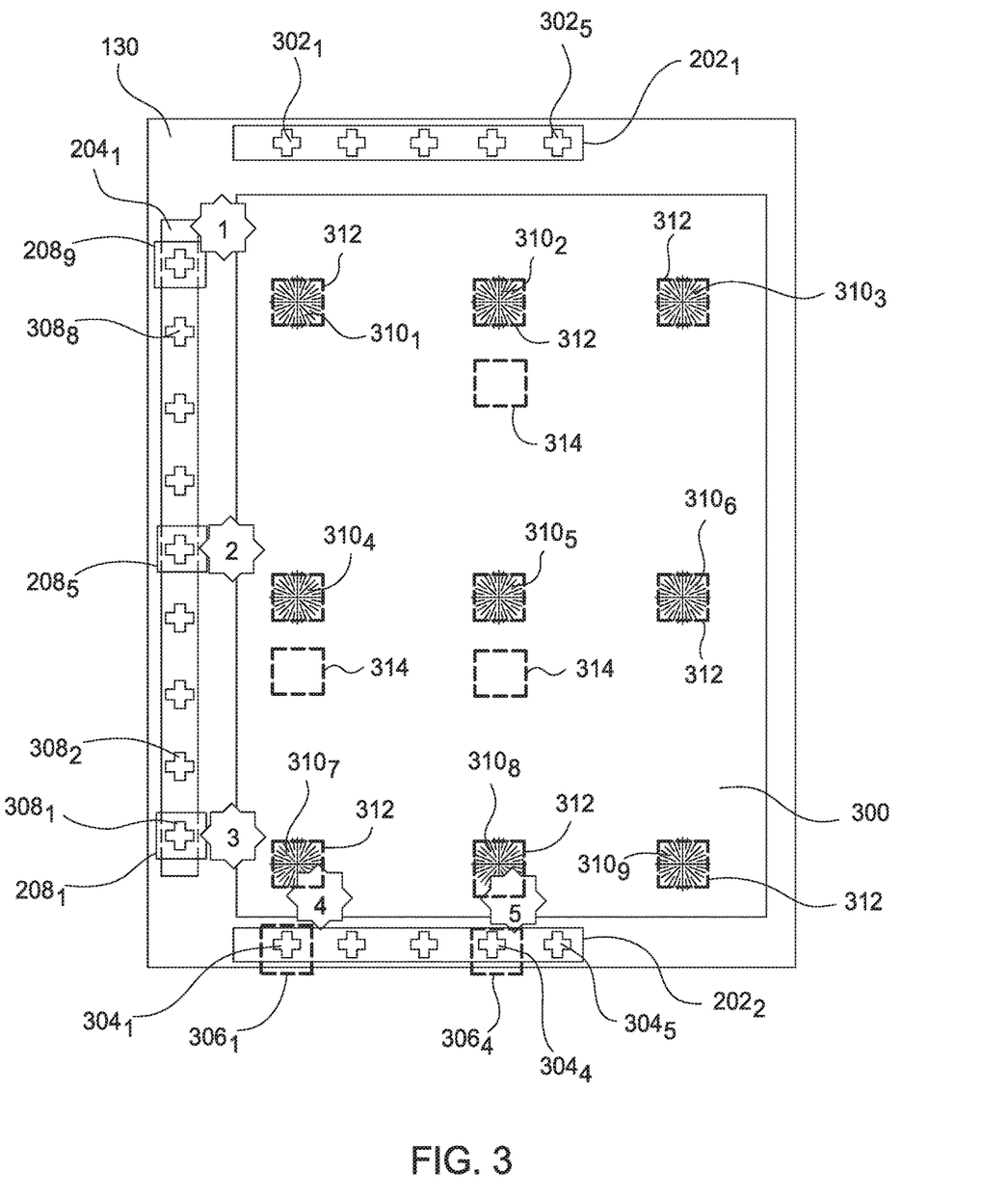
FIG. 3 depicts a top view of a chuck having reference marks and a reference plate that includes alignment marks, in accordance with embodiments disclosed herein.

FIG. 3 depicts a top view of the chuck 130 and a reference plate 300 in accordance with embodiments disclosed herein. The chuck 130 includes alignment regions $202_1$, $202_2$, and $204_1$. For simplicity, alignment region $204_2$ is not depicted in FIG. 3. As the chuck 130 and reference plate 300 move in the X-direction they eventually pass under the eyes 208. As the chuck 130 passes under the eyes 208, images of the reference marks 308 in the alignment region $204_1$ are simultaneously captured. For illustrative purposes only, alignment region $204_1$ is depicted as having nine reference marks. For simplicity in depicting FIG. 3, only three of the reference marks 308 (i.e., $308_1$, $308_2$, and $308_8$) include a lead-line and element number; and the field of view ("FOV") for only three eyes 208 (i.e., eyes $208_1$, $208_5$, and $208_9$) are shown over the reference marks 308. For illustrative purposes alignment region $202_1$ is depicted as including five alignment marks 302. However, for simplicity only two of the reference marks 302 (i.e., $302_1$ and $302_5$) include lead-lines and element numbers. Also for illustrative purposes, alignment region $202_2$ is depicted as including five alignment marks 304. However, for simplicity only three of the reference marks 304 (i.e., $304_1$, $304_4$, and $304_5$) include lead-lines and element numbers.

In FIG. 3, the reference marks 302, 304, and 308 are depicted as a plurality of "+" signs. For illustrative purposes, the reference marks 302; 304; and 308 and the eyes 208 have the same pitch. "Pitch" as used herein is defined as a separation between the reference marks 302, 304, and 308; and eyes 208.

For illustrative purposes only, capturing images and locations of the reference marks 302; 304; and 308 are described before capturing images and locations of the alignment marks 310. However, there is no temporal restriction on whether the capturing of images and the determination of locations for the reference marks 302; 304; and 308 occurs before the capturing of images and the determination of locations for the alignment marks 310. In other words, the capturing of images and the determination of locations for the reference marks 302; 304; and 308 can also occur simultaneously with the capturing of images and the determination of locations for the alignment marks 310; or the capturing of images and the determination of locations for the reference marks 302; 304; and 308 can occur after with the capturing of images and the determination of locations for the alignment marks 310.

Thereafter, in one embodiment the eyes 208 scan the alignment region $202_1$ and/or $202_2$. For example, the eyes 208 sequentially scan reference marks 304 as the alignment region $202_2$ passes under the eyes 208. Lead-lines $306_1$ and $306_2$ depict the FOV of the eyes 208 as the reference marks $304_1$ and $304_4$ pass under the eyes 208.

A reference plate 300 on top of the stage 130 moves in the X-direction as the chuck 130 moves. As the chuck 130 passes under the eyes 208 so too does the reference plate 300. The reference plate 300 includes at least one alignment mark 310. For illustrative purposes the reference plate 300 includes alignment marks $310_1$, $310_2$, $310_4$, $310_3$, $310_5$, $310_6$, $310_7$, $310_8$, and $310_9$ (collectively referred to herein as "alignment marks 310"). Each of the alignment marks 310 eventually falls within the FOV 312 of the eyes 208. FOV 314 represents the FOV of the eyes 208 as the reference plate 300 passes under the eyes 208 and there is no alignment mark 310 within the FOV.

In one embodiment, the reference plate 300 is presumed acceptable for calibration of the reference marks 302, 304, and/or 308 on the chuck 130 for use with subsequently used plates. The reference plate 300 is used to calibrate the reference marks 304, 308 to the alignment marks 310 on the reference plate 300 by creating a "reference plate model." In another embodiment, the reference plate 300 is a plate that was used (or intended for use) on a tool and can be used in a correction model for plates printed on a different tool.

After the reference marks 304, 308 and the alignment marks 310 have been scanned and captured, the reference plate 300 is removed. The processing unit 164 calculates the locations of the reference marks 304, 308 and the alignment marks 310; and creates a correction model (described in greater detail below). In one embodiment, the processing unit 164 determines the locations of the reference marks 304, 308 and the alignment marks 310 by applying an image processing algorithm(s) to find the position of the reference marks 304, 308 and alignment marks 310 within the FOV with respect to the center of the FOV. The distance of each center of the reference marks 304, 308 and the alignment marks 310 from the center of the FOV provides the deviation from the nominal location of the reference marks 304, 308 and the alignment marks 310. Examples of image processing algorithms may include, but are not limited to, a "correlation method," an "edge detection method" or a combination of the edge detection and correlation methods. The locations of the reference marks 304, 308; alignment marks 310; and correction model may be stored in memory 704.

Figure 4:
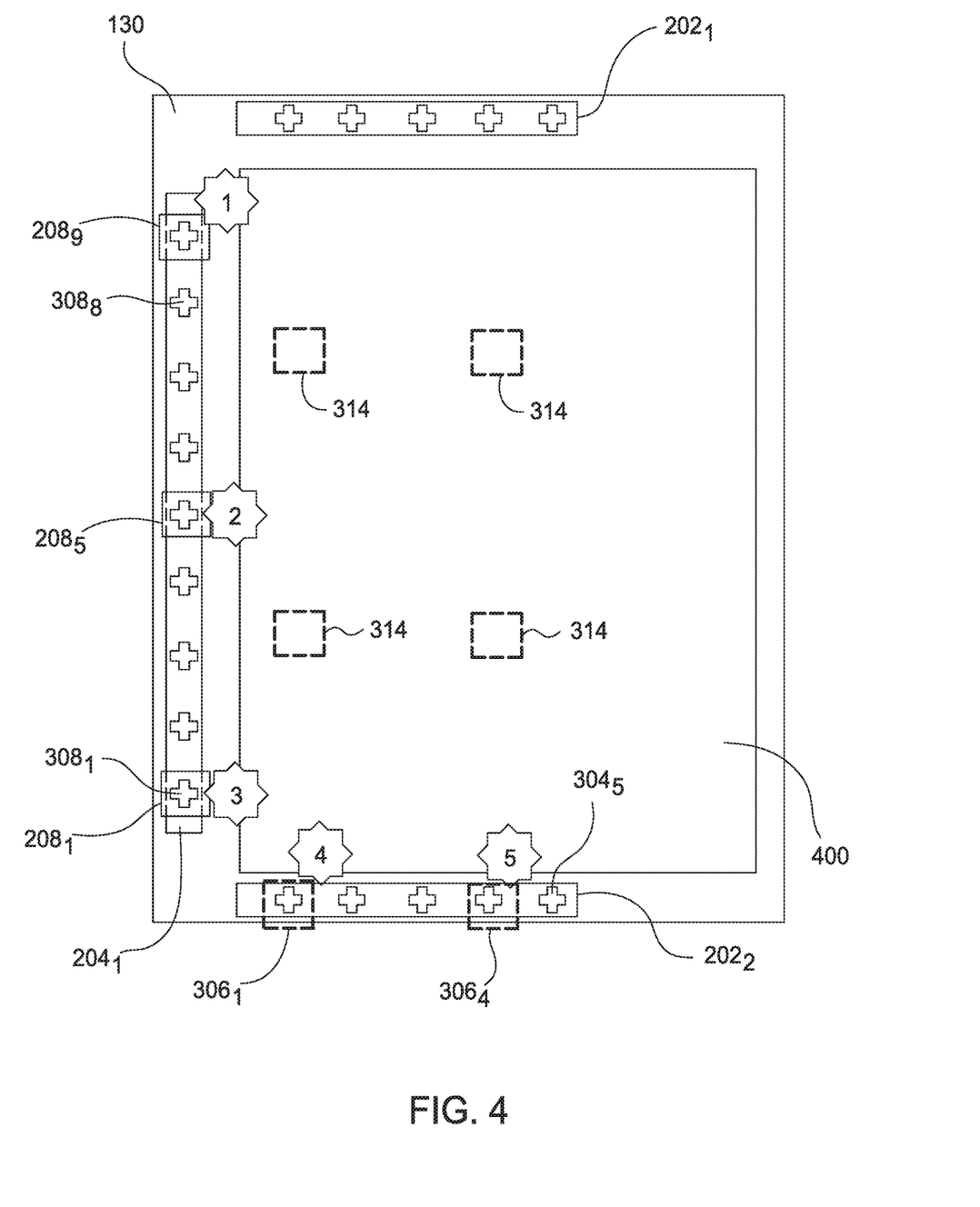
FIG. 4 depicts a top view of a chuck and a blank plate on the chuck in accordance with embodiments disclosed herein.

The correction model is used during printing of subsequent plates. FIG. 4 depicts a top view of a blank plate 400 on the chuck 130 in accordance with embodiments disclosed herein. FIG. 4 shows the chuck 130 and blank plate 400 passing under the eyes 208. The eyes 208 may capture new images of the reference marks 304, 308 before, during and/or after printing of a first layer on the blank plate 400. After the first layer has been printed on a predetermined number blank plates 400 (e.g., five), the locations of the reference marks 304, 308 (calculated from the new images of the reference marks 304, 308) can be used to determine whether a movement characteristic of the chuck 130 has changed.

Figure 5A:
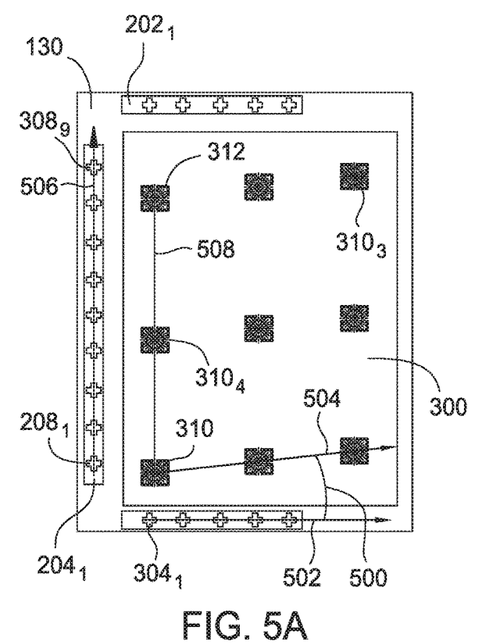
FIG. 5A depicts an example of a reference plate on a chuck in accordance with embodiments disclosed herein.

FIG. 5A depicts an example of a reference plate 300 on a chuck 130 in accordance with embodiments disclosed herein. The eyes 208 capture the reference marks 304, 308 on the chuck 130 and the alignment marks 310 on the reference plate 300. After some calculations by the processing unit 164 it is determined that the orientation of a line 504 passing through alignment marks 310 is different than the orientation of a line 502 passing through reference marks 304. Illustratively, the difference in pitch is depicted as an angle 500 that is formed from a horizontal line 502 through the reference marks 304 and a line 504 through the alignment marks 310. Although the reference marks 304, 308 are properly positioned on the chuck 130, the location of the alignment marks 310 indicate that the reference plate 300 has some orthogonality error, because the angle between line 504 and line 508 is not ninety degrees. The line 506 through reference marks 308 and the line 508 through alignment marks 310 are substantially parallel indicating alignment and little or no rotation with respect to the Y-axis.

Figure 5B:
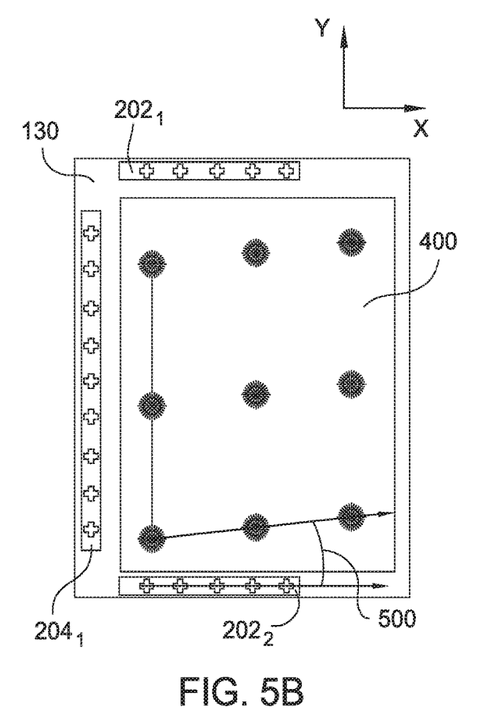
FIG. 5B depicts an example of a plate printed on the chuck using a correction model based upon the configuration depicted in FIG. 5A in accordance with embodiments disclosed herein.

FIG. 5B depicts an example of a plate printed 400 on the chuck 130 using a correction model based upon the configuration depicted in FIG. 5A in accordance with embodiments disclosed herein. The correction model provides a transformation for blank plate 400. "Transformation" as used herein is defined as the process of transforming positional measurement data from reference marks 304, 308 and alignment marks 310 (from at least one reference plate 300) to a subsequently printed plate (i.e., blank plate 400) by copying the printing characteristics of reference plate 300. In FIG. 5B, images of the reference marks 304 and alignment marks 310 indicate that the reference marks 304 are properly positioned, that the proper rotation is applied to the printed plate 310, and that the correction model is accurate.

Figure 6A:
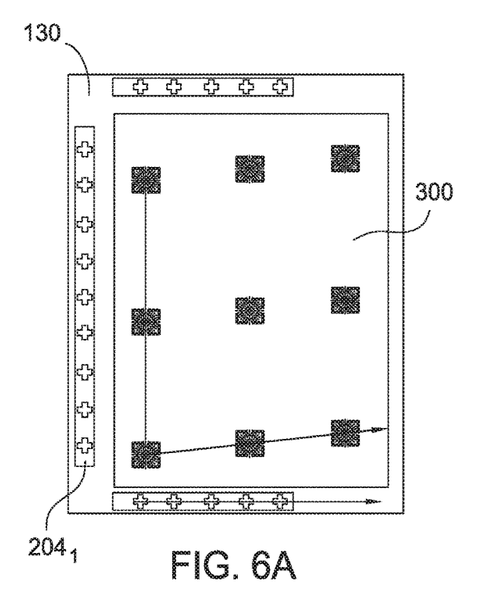
FIG. 6A depicts an example of a reference plate on a chuck in accordance with embodiments disclosed herein.

FIG. 6A depicts another example of a reference plate 300 on a chuck 130 in accordance with embodiments disclosed herein. The eyes 208 capture images of the reference marks 304, 308 on the chuck 130 and the alignment marks 310 on the reference plate 300. After some calculations by the processing unit 164 a determination is made that the pitch of the alignment marks 310 is different than the pitch of the reference marks 304, 308. Illustratively, the difference in pitch is depicted as an angle 500 that is formed from a horizontal line through the reference marks 304 and a line through the alignment marks 310. The location of the alignment marks 310 indicates that the reference plate 300 has some rotation with respect to the X-axis.

Figure 6B:
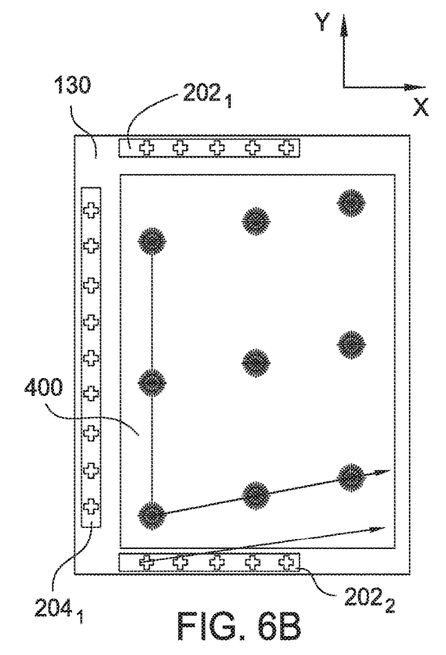
FIG. 6B depicts an example of a plate printed on the chuck using a correction model based upon the configuration depicted in FIG. 5A in accordance with embodiments disclosed herein.

FIG. 6B depicts an example of a plate printed 400 on the chuck 130 using a correction model based upon the configuration depicted in FIG. 6A in accordance with embodiments disclosed herein. After a number of plates have been printed, the eyes 208 capture new images of the reference marks 304, 308 and alignment marks 310. Comparing the locations calculated from the new images to the locations of the reference marks 304, 308 and alignment marks 310 stored in memory reveals that the reference marks 304 have shifted from the earlier stored locations.

Figure 7:
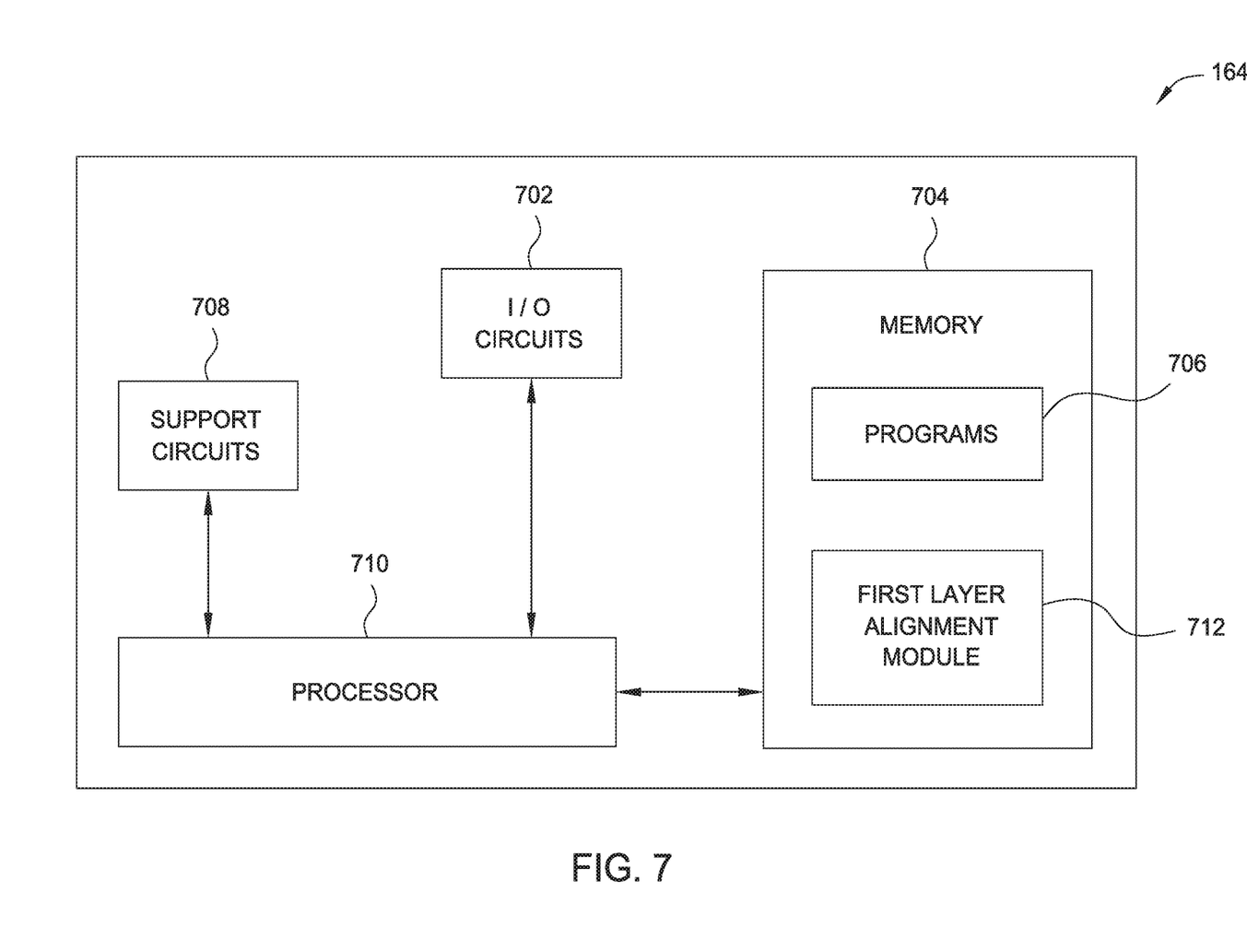
FIG. 7 depicts an embodiment of a high-level block diagram of a processing unit for alignment of a blank plate on the chuck in accordance with embodiments disclosed herein.

FIG. 7 depicts an embodiment of a high-level block diagram of a processing unit 164 for alignment of a blank plate 400 on a chuck 130 in accordance with embodiments disclosed herein. For example, the processing unit 164 is suitable for use in performing the methods of FIGS. 8 and 9. The processing unit 164 in FIG. 7 includes a processor 710 as well as a memory 704 for storing control programs, measurement data and the like.

In various embodiments, memory 704 also includes programs (e.g., depicted as a "first layer alignment module" 712) for creating a correction model for alignment of the first layer on a printed plate with the chuck 130 by performing the embodiments described herein. Memory 704 includes programs (not shown) for mask designs. In an embodiment, files regarding mask design are stored in graphic data system files (e.g., "GDS"). However, the files can be any format which provides graphic data. When instructed these programs determine which mirrors transmit unused light to a light dump and which mirrors illuminate the substrate based upon the correction model(s).

The processor 710 cooperates with support circuitry 708 such as power supplies, clock circuits, cache memory and the like as well as circuits that assist in executing the software routines 706 stored in the memory 704. As such, it is contemplated that some of the process steps discussed herein as software processes can be loaded from a storage device (e.g., an optical drive, floppy drive, disk drive, etc.) and implemented within the memory 704 and operated by the processor 710. Thus, various steps and methods of the present material can be stored on a computer readable medium. The processing unit 164 also contains input-output circuitry 702 that forms an interface between the various functional elements communicating with the processing unit 164.

Although FIG. 7 depicts a processing unit 164 that is programmed to perform various control functions in accordance with the present disclosure, the term computer is not limited to just those integrated circuits referred to in the art as computers, but broadly refers to computers, processors, microcontrollers, microcomputers, programmable logic controllers, application specific integrated circuits, and other programmable circuits, and these terms are used interchangeably herein. In addition, although one processing unit 164 is depicted, that depiction is for brevity on. It is appreciated that each of the methods described herein can be utilized in separate computers.

Figure 8:
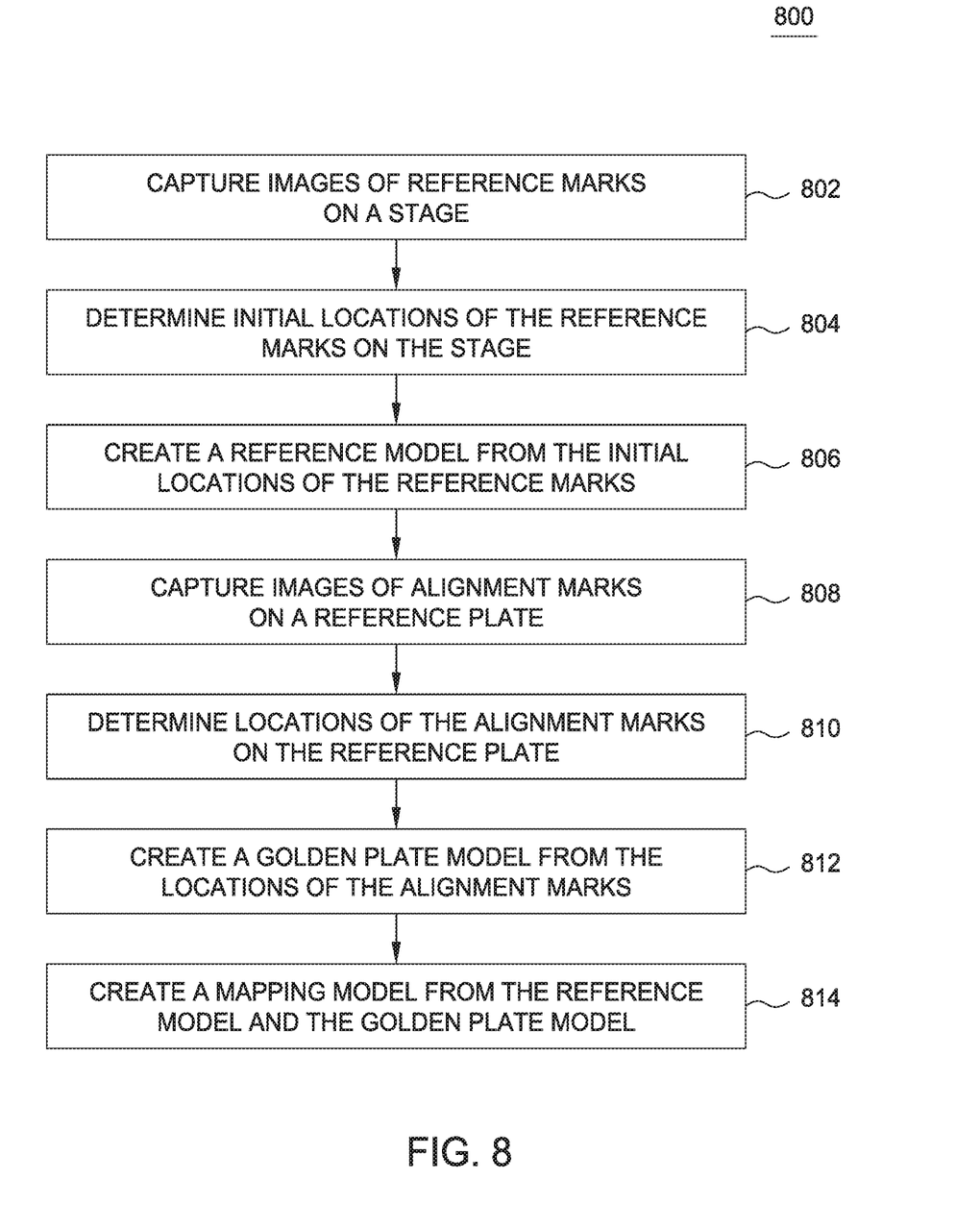
FIG. 8 depicts an embodiment of a method of aligning a first layer on a printing plate with the chuck in accordance with embodiments disclosed herein.

FIG. 8 depicts an embodiment of a method 800 of aligning a printing plate 400 with the chuck 130 in accordance with embodiments disclosed herein. At block 802, eyes 208 capture images of reference marks 304, 308 on the chuck 130. At block 804, the captured images are used by the processing unit 164 to determine the initial locations of the reference marks 304, 308. At block 806, a reference model created from the initial locations of the reference marks 304, 308. The reference model includes rotation and/or orientation of the reference marks 304, 308 with respect to an axis (e.g., the X-axis). For example, if the reference marks 304 are rotated five degree with respect to the X-axis then an inverse of the rotation is applied. In this example the reference model would include minus five degrees as a correction. The reference model can also include other variations like scaling which is defined by separation between reference marks 304, 308 and/or the angle between reference marks 304 and reference marks 308.

At block 808, the eyes 208, capture images of alignment marks 310 on a reference plate 300. At block 810, the processing unit 164 utilizes software to determine the locations of the alignment marks 310 on the reference plate 300. At block 812, a reference plate model is created from the locations of the alignment marks 310. Rotation and/or orientation of the reference plate 300 with respect to the reference marks 304, 308 is accounted for in the reference plate model. For example, if the reference plate 300 is rotated ten degrees with respect to the X-axis then the reference plate model includes the same ten degree rotation for printing other plates. At block 814, a mapping model is created based upon the reference model and the reference plate mode.

For example, in FIG. 5A the location of the alignment marks 310 indicates that there is some rotation of reference plate 300 with respect to the X-axis. The locations of the reference marks 304, 308 indicate that the reference marks 304, 308 are properly positioned and substantially parallel to the X-axis and Y-axis. In FIG. 5A, the reference model is zero. However, the alignment marks 310 on the reference plate 300 are shifted in a way that a line 504 crossing through the center of alignment marks 310 creates an angle with respect to the X-axis. As an example, if this angle is one degree, the mapping model includes the same one degree rotation (from the reference plate model) for printing subsequent plates to create the same mark shift (as shown in FIG. 5B).

Figure 9:
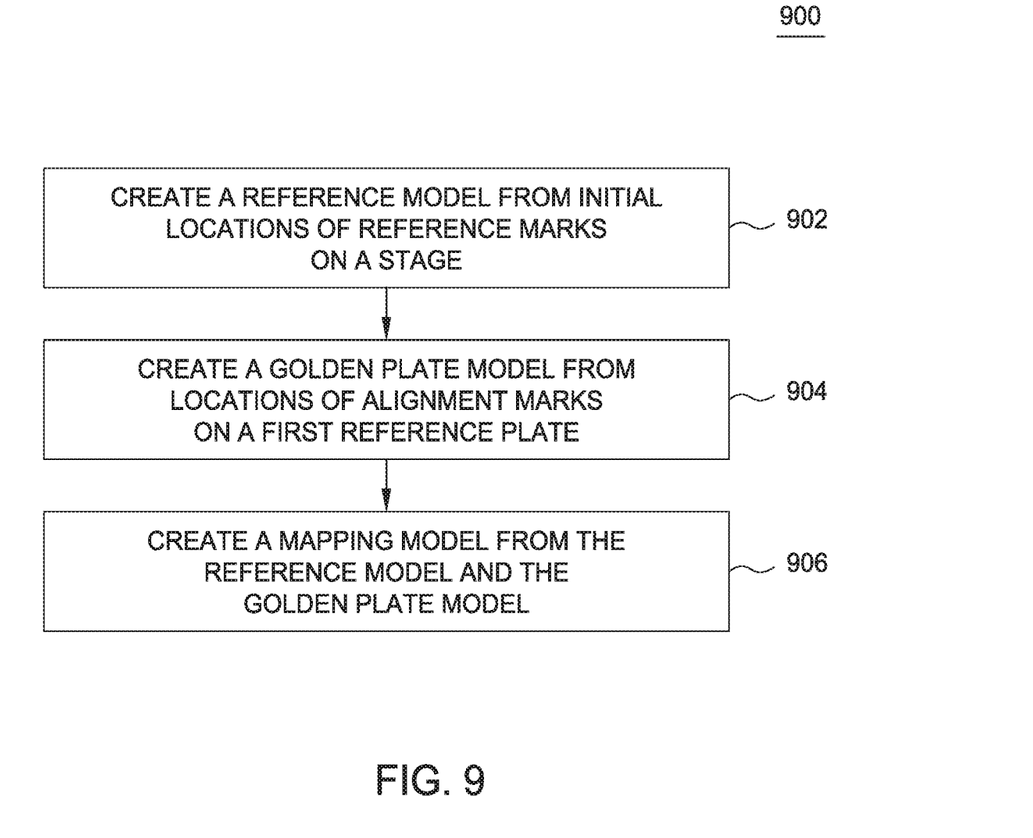
FIG. 9 depicts an embodiment of a method of aligning a first layer on a printing plate with the chuck in accordance with embodiments disclosed herein.

FIG. 9 depicts an embodiment of a method 900 of aligning a printing plate 400 with the chuck 130 in accordance with embodiments disclosed herein. At block 902, a reference model is created from initial locations of reference marks 304, 308 on a chuck 130. The reference marks 304, 308 can be retrieved from memory 704 and the first layer alignment module 712 may be used to create the reference model.

At block 904, a reference plate model is created from the locations of alignment marks 310 located on the reference plate 300. The reference plate model follows (i.e., mimics) rotation, shift, and/or distortion in the locations of the alignment marks 310 on the reference plate 300. At block 906, a mapping model is created from the reference model and the reference plate model.

Figure 10:
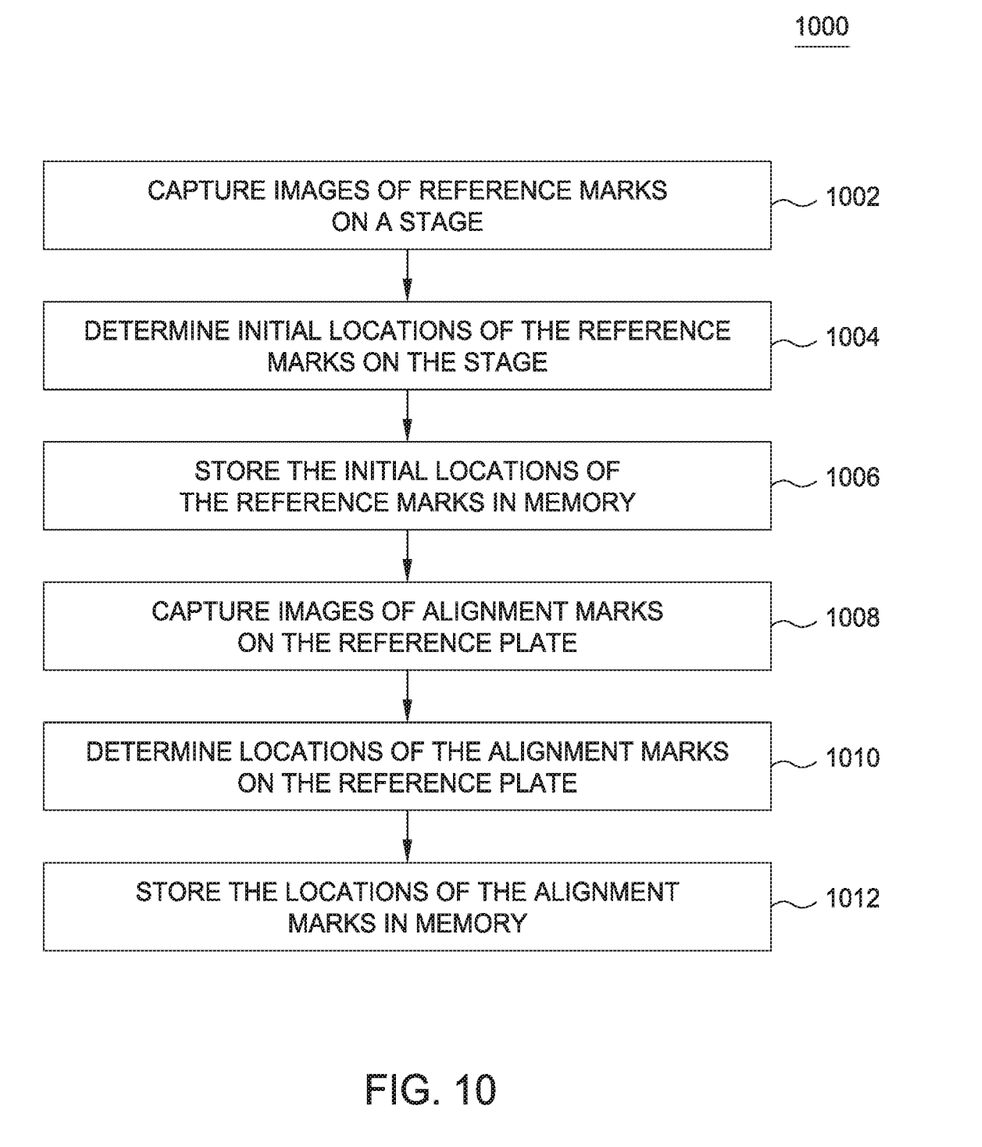
FIG. 10 depicts an embodiment of a method of aligning a first layer on a printing plate with the chuck in accordance with embodiments disclosed herein.

FIG. 10 depicts an embodiment of a method 1000 of aligning a printing plate 400 with the chuck 130 in accordance with embodiments disclosed herein. At block 1002, images of the reference marks 304, 308 are captured from the chuck 130. At block 1004, initial locations of the reference marks on the chuck 130 are determined. At block 1006, the initial locations of the reference marks 304, 308 are stored in memory 704.

At block 1008, images of alignment marks 310 on the reference plate 300 are captured. At block 1010, the locations of the alignment marks 310 are determined by the processing unit 164. Thereafter, at block 1012, the locations of the alignment marks 310 are stored in memory 704.

Alternative embodiments of the methods 800, 900, and 1000 may include storing images of the reference marks 304, 308 and alignment marks 310 in memory 704 for later determination of the locations of those marks by the processing unit 164. In addition, embodiments herein have been described as including determining the initial locations of the reference marks 304, 308 prior to determining the locations of the alignment marks 310. However, other embodiments include determining the initial locations of the alignment marks 310 prior to determining the locations of the reference marks 304, 308.

As used herein, the terms "having," "containing," "including," "comprising" and the like are open ended terms that indicate the presence of stated elements or features, but do not preclude additional elements or features. The articles "a," "an," and "the" are intended to include the plural as well as the singular, unless the context clearly indicates otherwise.

While the foregoing is directed to embodiments of the present disclosure, other and further embodiments of the disclosure may be devised without departing from the basic scope thereof, and the scope thereof is determined by the claims that follow.

We claim:

1. A method, comprising:
   capturing images of reference marks on a chuck while moving the chuck relative to camera eyes;
   determining initial locations of the reference marks on the chuck with respect to the camera eyes;
   creating a reference model from the initial locations of the reference marks;
   capturing images of alignment marks on a reference plate;
   removing the reference plate;
   determining locations of the alignment marks on the reference plate with respect to the camera eyes;
   creating a reference plate model from the locations of the alignment marks; and
   creating a mapping model from the reference model and the reference plate model.

2. The method of claim 1, wherein creating the mapping model comprises:
   applying an inverse of a shift in reference mark positions; and
   applying a shift in the reference plate based on the reference plate model.

3. The method of claim 1, further comprising:
   printing a first layer on at least one blank plate using the mapping model;
   recapturing images of the reference marks;
   determining subsequent locations of the reference marks; and
   comparing the subsequent locations to the initial locations of the reference marks.

4. The method of claim 1, wherein capturing images of alignment marks on the reference plate and reference marks on the chuck comprises:
   scanning in an X direction;
   moving to a neighboring eye on an adjacent line; and
   repeating the scanning and the moving until images of the reference marks and the alignment marks are captured.

5. The method of claim 1, wherein the reference marks are removable from the chuck.

6. The method of claim 1, further comprising:
   capturing alignment marks on a second reference plate, on the chuck, to determine active reference mark positions wherein,
      the second reference plate is designed for use on a second device;
   creating a variation model based on differences between the active reference mark positions and the initial reference mark locations:
   creating an active alignment model based on the variation model and the mapping model; and
   applying an inverse of the active alignment model as a correction model.

7. A method, comprising:
   creating a reference model from initial locations of reference marks on a chuck with respect to camera eyes;
   creating a reference plate model from locations of alignment marks on a first reference plate with respect to the camera eyes, wherein the first reference plate moves with the chuck; and
   creating a mapping model from the reference model and the reference plate model.

8. The method of claim 7, wherein the reference marks are removable from the chuck.

9. The method of claim 7, further comprising:
   capturing alignment marks on a second reference plate, on the chuck, to determine active reference mark locations wherein,
      the second reference plate was designed for use on a second device;
   creating a variation model based on differences between the active reference mark locations and the initial reference mark locations:
   creating an active alignment model based on the variation model and the mapping model; and
   applying an inverse of the active alignment model as a correction model.

10. The method of claim 7, wherein,
    creating the reference model comprises:
       capturing images of reference marks on the chuck, and determining initial locations of the reference marks on the chuck; and
    creating the reference plate model comprises:
       capturing images of alignment marks on a reference plate;
       determining locations of the alignment marks on the reference plate.

11. The method of claim 7, further comprising:
    recapturing images of the reference marks after printing on at least one blank plate using the mapping model;
    determining subsequent locations of the reference marks from the recaptured images; and
    comparing the subsequent locations to the initial locations.

12. The method of claim 7, further comprising:
capturing alignment marks on a second reference plate, on the chuck, to determine active reference mark locations wherein,
the second reference plate was designed for use on a second device; and
storing the alignment marks from the second reference plate in memory.

13. The method of claim 7, wherein creating a reference model from initial locations of reference marks further comprises:
scanning the chuck in an X direction;
capturing images of the reference marks;
moving to a neighboring eye;
repeating the scanning and the moving until all images of the reference marks are captured;
calculating locations of the reference marks; and
storing the locations of the reference marks in memory.

14. The method of claim 7, wherein creating a reference plate model from locations of alignment marks further comprises:
scanning the first reference plate in an X direction;
capturing images of the alignment marks;
moving to a neighboring eye;
repeating the scanning and the moving until all images of the alignment marks are captured;
calculating locations of the alignment marks; and
storing the locations of the alignment marks in memory.

15. The method of claim 14, further comprising:
capturing alignment marks on a second reference plate, on the chuck, to determine active reference mark locations wherein,
the second reference plate was designed for use on a second device;
creating a variation model based on differences between the active reference mark locations and the initial reference mark locations:
creating an active alignment model based on the variation model and the mapping model; and
applying an inverse of the active alignment model as a correction model.

16. A method, comprising:
capturing images of reference marks on a chuck;
determining initial locations of the reference marks on the chuck with respect to camera eyes by moving the chuck relative to the camera eyes;
storing the initial locations of the reference marks in memory;
capturing images of alignment marks on a reference plate that moves with the chuck;
removing the reference plate;
determining locations of the alignment marks on the reference plate with respect to the camera eyes; and
storing the locations of the alignment marks in memory.

17. The method of claim 16, further comprising:
printing on at least one blank plate;
recapturing images of the reference marks on the chuck;
determining subsequent locations of the reference marks; and
comparing the subsequent locations of the reference marks to the initial locations of the reference marks.

18. The method of claim 17, further comprising:
replacing the initial locations of the reference marks in memory with the subsequent locations of the reference marks;
recapturing images of the alignment marks on the reference plate;
determining locations of the alignment marks on the reference plate from the recaptured images; and
storing the locations of the alignment marks in memory.

19. The method of claim 16, further comprising creating a reference tool model based on the locations of the reference marks and the locations of the alignment marks.

20. The method of claim 19, further comprising:
capturing alignment marks on another plate to determine active reference mark locations;
creating a variation model based on differences between the active reference mark locations and the initial reference mark locations:
creating an active alignment model based on the variation model and the reference tool model; and
applying an inverse of the active alignment model as a correction model.

* * * * *